United States Patent [19]

Ogitani

[11] Patent Number: 4,991,359
[45] Date of Patent: Feb. 12, 1991

[54] METHOD OF ABRADING A HARDENED RESIN

[75] Inventor: Osamu Ogitani, Koshigaya, Japan

[73] Assignee: Somar Corporation, Japan

[21] Appl. No.: 428,622

[22] Filed: Oct. 30, 1989

[30] Foreign Application Priority Data

Oct. 31, 1988 [JP] Japan .................................. 63-275921

[51] Int. Cl.$^5$ ................................................ B24D 3/00
[52] U.S. Cl. .......................................... 51/293; 51/298; 51/308
[58] Field of Search .......................... 51/293, 298, 308

[56] References Cited

U.S. PATENT DOCUMENTS

| | | | |
|---|---|---|---|
| 4,118,459 | 10/1978 | Falkenhain et al. | 51/293 |
| 4,456,500 | 6/1984 | Ibata | 51/293 |
| 4,548,617 | 10/1985 | Miyatani et al. | 51/298 |
| 4,866,885 | 9/1989 | Dodsworth | 51/293 |

Primary Examiner—William R. Dixon, Jr.
Assistant Examiner—Willie J. Thompson
Attorney, Agent, or Firm—Lorusso & Loud

[57] ABSTRACT

A method of treating a metal-plated board for the removal of a hardened, alkali-soluble resin layer therefrom, comprising the steps of:
(a) contacting a surface of the resin layer with an aqueous alkaline liquid such as an aqueous sodium carbonate solution to swell the surface;
(b) abrading the resin layer having the swollen surface, step (b) being preceded by or simultaneous with step (a); and
(c) then washing the abraded surface with an aqueous neutral liquid such as water.

6 Claims, 1 Drawing Sheet

METHOD OF ABRADING A HARDENED RESIN

BACKGROUND OF THE INVENTION

This invention relates generally to a method of abrading a hardened resin and, more specifically to a method of removing an excess resin layer of an alkali-soluble resin formed on a metal-plated board during the plugging of metal-plated through-holes of the board with the alkali-soluble resin.

Recent development of electronics art demands printed wiring boards having a high circuit density. Thus, printed wiring boards provided with wiring patterns on both sides thereof are now increasingly used.

One known method for the production of such a both-sides wiring boards includes the steps of: drilling or punching a board to form a multiplicity of through-holes, plating copper on both sides of the board and on inside walls of the through-holes, plugging the through-holes with an alkali-soluble resin, curing or hardening the resin within the through-holes, abrading or sanding both surfaces of the metal-plated board to remove a layer or deposit of the resin thereon, screen printing positive patterns with an alkali-soluble resist, curing the resist patterns, etching the exposed metal layer with an acidic etching liquid, and removing the resist patterns and the plugged resin using a 2–3% aqueous sodium hydroxide solution.

The plugging of the through-holes is generally performed as follows. A curable or hardenable resin is first applied to the board by means of, for example, a roll coater to plug the through-holes. An excess resin on the surface of the board is then removed by a squeegee and the resin plugged in the through-holes is heat-treated or UV-treated for effecting curing or hardening. The resulting board is then sanded or abraded by means of a buff roll or a belt sander to remove a layer of the hardened resin, which has been failed to be removed during the treatment with the squeegee, and to clean the surface of the metal-plated board.

As a resin for plugging through-holes of the board, there has been used a heat-curable or a photo-curable resin. Since a photo-curable resin can be hardened within a shorter period of time as compared with a heat-curable resin and since the former resin is substantially free of change of volume upon hardening, recent trend is toward the use of the former resin. The former resin, however, poses a problem that it is difficult to remove hardened resin by abrasion because of its hardness.

In particular, the removal of the hardened resin by abrasion with a belt sander tends to cause abrasion or injury of the metal layer to which the hardened resin sticks so that in the subsequent screen printing step a photoresist ink tends to blur the surface of the metal layer or the ink pattern fails to firmly adhere thereto. Further, the abrasion of the metal layer sometimes causes electrical disconnection. Thus, in order to prevent such abrasion of the metal layer, it is necessary to operate the belt sander slowly and gently. This, however, requires a long process time.

SUMMARY OF THE INVENTION

It is, therefore, an object of the present invention to provide a method in which the above problems of the conventional method has been solved.

It is a prime object of the present invention to provide a method of removing a hardened, alkali-soluble resin layer or deposit on a metal-plated board within a short period of time without injuring the plated metal layer.

In accomplishing the foregoing objects, the present invention provides a method of treating a metal-plated board for the removal of a hardened, alkali-soluble resin layer therefrom, comprising the steps of:

(a) contacting a surface of the resin layer with an aqueous alkaline liquid to swell said surface;

(b) abrading the resin layer having the swollen surface, step (b) being preceded by or simultaneous with step (a); and (c) then washing the abraded surface with an aqueous neutral liquid.

BRIEF DESCRIPTION OF THE DRAWINGS

Other objects, features and advantages of the present invention will become apparent from the detailed description of the invention which follows, when considered in light of the accompanying drawings, in which.

DETAILED DESCRIPTION OF THE INVENTION

Figure 1:
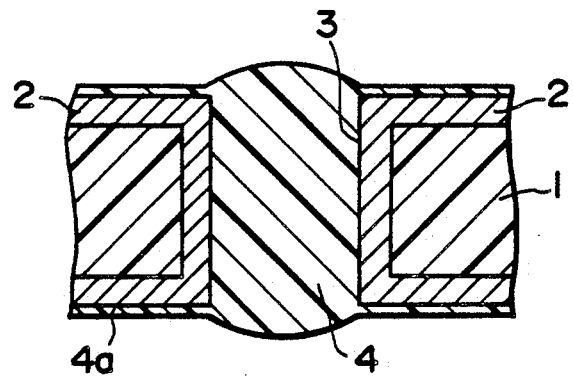
FIG. 1 is a partial, cross-sectional view diagrammatically showing a metal-plated board to be treated.

FIG. 1 depicts a metal-plated board to be treated in accordance with the method of the present invention. Designated as 1 is an insulating board having a multiplicity of of through-holes 3. The both sides of the board 1 and the inside surfaces of the through-holes 3 are provided with a copper plated layer 2. Each through-hole 3 is plugged with a hardened resin 4 which has been formed by plugging the through-hole 3 with a hardenable resin, followed by removing excess resins with, for example, a squeegee and hardening by, for example, irradiation of UV rays as described previously. The reference numeral 4a denotes a hardened resin layer on each of the copper layers 2 which remains unremoved during the squeegee treatment. The layer 4a including a protruded portion above the through-hole 3 is to be removed by the method of the present invention. For the simplicity of explanation, the following description will be made for the removal of the resin layer 4a on one of the both sides of the board.

Figure 2:
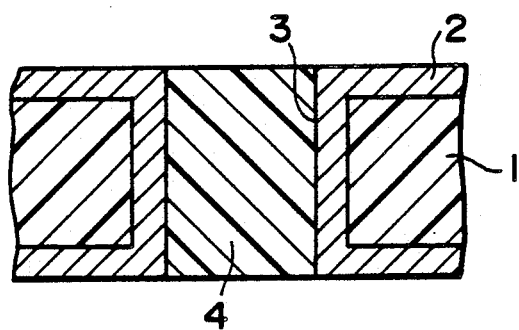
FIG. 2 is a view similar to FIG. 1 showing the state in which a resin layer has been removed in good conditions.
Figure 3:
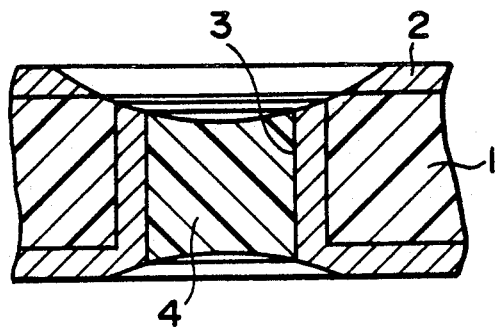
FIG. 3 is a view similar to FIG. 2 showing the state in which a resin layer has been removed excessively.

In the method according to the present invention, a hardened resin layer 4a to be removed is contacted with an aqueous alkaline liquid during or prior to abrasion. By this, the surface of the resin layer 4a is swollen and softened so that the resin layer 4a can be easily abraded or ground while minimizing or preventing injury of a surface of the underlying, plated metal layer 2. FIGS. 2 and 3 illustrate states of the metal plated board 1 from which such resin layers 4a have been removed in desirable and undesirable conditions, respectively. In the state shown in FIG. 3, the copper layer 2 is broken and electrical disconnection is caused by excessive abrasion. The present invention is effective in avoiding such undesirable conditions as shown in FIG. 3 and can provide such desirable conditions as shown in FIG. 2.

The resin layer 4a to be removed is a hardened, alkali-soluble resin such as obtained by thermally or photo-chemically polymerizing a hardenable composition containing a monomer or an oligomer having an acrylic or methacrylic group. A photo-hardenable composition including an alkali-soluble polymer (e.g. a rosin or modified rosin), a carboxyl group-containing, monofunctional monomer, a monofunctional monomer or oligomer having one ethylenically unsaturated group but having no carboxyl group (e.g. acrylates or methacrylates), and a photopolymerization initiator is preferably used. Such a composition is disclosed in, for example, Japanese Published Unexamined Patent Application (Tokkyo Kokai) No. Sho-62-59606.

The aqueous alkaline liquid to be used for swelling a surface of the resin layer 4a is preferably an aqueous solution containing an inorganic alkaline compound such as alkali carbonate, an alkali hydroxide or an alkali silicate. Illustrative of suitable alkaline compounds are sodium carbonate, potassium carbonate, sodium hydroxide, potassium hydroxide, ammonium hydroxide and sodium silicate. The aqueous alkaline liquid generally has a pH of 9–14, preferably 10–13. If desired, a surfactant or an anti-foaming agent may be incorporated into the aqueous alkaline liquid.

The contact of the resin layer 4a with the aqueous alkaline liquid can be effected, for example, by spraying the aqueous alkaline liquid through a spray nozzle over the surface of the resin layer 4a or by dipping the board within a bath of the aqueous alkaline liquid. The swollen surface is abraded by means of an abrasion device such as a brush roll, a belt sander or a buff roll.

The method of the present invention is suitably carried out automatically by securing a board to be treated to a conveyor and conveying same at a speed of 1–3 m/minute through the abrasion device for pressure and moving contact with the operating surface of an abrasion device while spraying an aqueous alkaline liquid from a nozzle, disposed adjacent to the spraying device, over the surface of the resin layer to be abraded. By suitably positioning the spray nozzle, the abrasion may be effected simultaneously with or subsequent to the swelling. Simultaneous swelling and abrasion treatment can also be performed by abrading the resin layer to be treated with a buff roll impregnated with the aqueous alkaline liquid.

The resulting board from which the resin layer has thus been removed is then washed with an aqueous neutral liquid such as water. The board having the thus cleaned copper layer is then subjected to screen printing with a resist ink for the formation of a desired pattern.

The following examples will further illustrate the present invention.

EXAMPLE 1

A copper clad laminate (thickness: 1.6 mm) having a multiplicity of through-holes (diameter: 2 mm) was subjected to hole-plugging using a UV-hardenable resin (SOMACOTE TH-500-12, manufactured by Somar Corporation) by means of a roll coater. After removing excess resin on the laminate by means of a squeegee, the laminate was irradiated from both sides thereof by high pressure UV lamps (80 W/cm) from a distance of 15 cm to harden the resin. The laminate bearing hardened resin deposits on the surface of the copper layer was passed at a traveling speed of 2 m/minute through a pair of rotating buff rolls (#600) for abrasion of the resin deposits. An aqueous sodium carbonate solution (concentration: 1% by weight, pH: 10.7) was sprayed through spray nozzles over the surfaces of the resin deposits which surfaces were being abraded by the buff roll so that the abrasion and swelling steps were carried out simultaneously. The abraded surfaces were then washed with water. As a result, the resin deposits were completely removed and each of the opposing copper layers had a flat clean surface.

EXAMPLE 2

Example 1 was repeated in the same manner as described except that the abrasion step was preceded by the swelling step and that the abrasion step was performed using a pair of brush rolls while spraying water over the surfaces of the resin deposits which were being abraded. The swelling step was carried out by dipping the board for 5 seconds in a bath of a 0.5% by weight aqueous sodium hydroxide solution (pH 12.6). As a result, the resin deposits were completely removed and each of the opposing copper layers had a flat clean surface.

COMPARATIVE EXAMPLE 1

Example 1 was repeated in the same manner as described except that water was used in lieu of the sodium carbonate solution. It was revealed that the resin deposits were not completely removed.

COMPARATIVE EXAMPLE 2

Comparative Example 1 was repeated in the same manner as described except that buff rolls were replaced by brush rolls. It was revealed that the resin deposits were not completely removed.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description, and all the changes which come within the meaning and range of equivalency of the claims are therefore intended to be embraced therein.

What is claimed is:

1. A method comprising the steps of:
   (a) contacting a surface of the resin layer with an aqueous alkaline liquid selected from the group consisting of aqueous solution of an alkali carbonate, alkali hydroxide or alkali silicate, having a pH of 9–14 to swell said surface;
   abrading the resin layer having the swollen surface, step (b) being preceded by or simultaneous with step (a); and
   (c) then washing the abraded surface with an aqueous neutral liquid.

2. A method according to claim 1, wherein step (a) is effected by spraying the aqueous alkaline liquid over the surface of the resin layer.

3. A method according to claim 1, wherein step (b) is effected by using a belt sander, a brush roll or a buff roll.

4. A method according to claim 1, wherein step (b) is effected by using a buff roll impregnated with the aqueous alkaline liquid.

5. A method according to claim 1, wherein the alkali-soluble resin is a hardened resin obtained by photopolymerization of a composition comprising an alkali-soluble polymer, a carboxyl group-containing, monofunctional monomer, a monofunctional monomer or oligomer having one ethylenically unsaturated group but having no carboxyl group, and a photopolymerization initiator.

6. A method according to claim 1, wherein said aqueous neutral liquid is water.

* * * * *

UNITED STATES PATENT AND TRADEMARK OFFICE
CERTIFICATE OF CORRECTION

PATENT NO. : 4,991,359
DATED : February 12, 1991
INVENTOR(S) : OGITANI et al

It is certified that error appears in the above-identified patent and that said Letters Patent is hereby corrected as shown below:

Col. 4, line 39, first line of Claim 1, before "comprising" insert: --of treating a metal-plated board for the removal of a hardened, alkali-soluble resin layer therefrom,--.

Signed and Sealed this

Twenty-second Day of September, 1992

Attest:

DOUGLAS B. COMER

*Attesting Officer*   *Acting Commissioner of Patents and Trademarks*